US010078106B2

(12) United States Patent
Taylor

(10) Patent No.: US 10,078,106 B2
(45) Date of Patent: Sep. 18, 2018

(54) RING CIRCUIT CONTINUITY TESTER

(71) Applicant: INTERNATIONAL BUSINESS MACHINES CORPORATION, Armonk, NY (US)

(72) Inventor: James S. Taylor, Hursley (GB)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 465 days.

(21) Appl. No.: 14/835,913

(22) Filed: Aug. 26, 2015

(65) Prior Publication Data

US 2016/0097800 A1   Apr. 7, 2016

(30) Foreign Application Priority Data

Oct. 6, 2014   (GB) .................................. 1417622.6

(51) Int. Cl.
*G01R 31/02*   (2006.01)
*H02H 5/10*   (2006.01)

(52) U.S. Cl.
CPC ............. *G01R 31/026* (2013.01); *H02H 5/10* (2013.01)

(58) Field of Classification Search
CPC ................................ G01R 31/026; H02H 5/10
See application file for complete search history.

(56) References Cited

U.S. PATENT DOCUMENTS

2013/0261999 A1   10/2013   Brashear

FOREIGN PATENT DOCUMENTS

| CN | 103499766 A | 1/2014 | |
|---|---|---|---|
| EP | 1148608 B1 | 10/2001 | |
| GB | 2499514 A * | 8/2013 | ............. G01R 27/16 |
| GB | 2506669 A * | 4/2014 | ............. H01R 13/701 |
| WO | WO 2011/080546 A1 | 7/2011 | |
| WO | WO 2013093535 A1 | 6/2013 | |

OTHER PUBLICATIONS

Multimeter, available at http://web.archive.org/web/20130121001009/ https://en.wikipedia.org/wiki/Multimeter, available on Jan. 21, 2013.*

(Continued)

*Primary Examiner* — Daniel Miller
(74) *Attorney, Agent, or Firm* — Richard A. Wilhelm, Esq.; Kevin P. Radigan, Esq.; Heslin Rothenberg Farley & Mesiti P.C.

(57) ABSTRACT

Apparatus and method are provided for testing continuity of a ring circuit of an electricity distribution system, the ring circuit including at least a first conductor connecting, in a ring configuration, a source of electricity to a plurality of accessories. The apparatus includes: a switch arranged to cause a break in the ring circuit at a location in the ring circuit, the break resulting in a first end and a second end of the ring circuit at the location; a detector for measuring the relative voltage between the first end and the second end of the ring circuit; and an indicator which indicates, responsive to the detector detecting a relative voltage between the first end and the second end of the ring circuit, that there is a lack of continuity in the ring circuit.

16 Claims, 6 Drawing Sheets

(56) References Cited

OTHER PUBLICATIONS

Whitfield, J., "The Electricians Guide IEEE Regulations", Electricians Guide, 5th Ed., Chapter 8.4.2—Ring Final Circuit Continuity, (http://www.tlc-direct.co.uk/Book/8.4.2.htm), downloaded Jul. 28, 2014 (4 pages).
Textbook: "NVQ2 Electrical Installations", Chapter 6: Basic Electrical Circuity and Applications (pp. 119-150).
Product Catalogue: "SF6 Insulated Compact Switchgear,type SafePlus and SF6 Insulated Ring Main Unit, type SafeRing", ABB Technology Ltd. (76 pages).

* cited by examiner

RING CIRCUIT CONTINUITY TESTER

PRIOR FOREIGN APPLICATION

This application claims priority from United Kingdom patent application number 1417622.6, filed Oct. 6, 2014, which is hereby incorporated herein by reference in its entirety.

BACKGROUND

The present invention relates to devices for testing ring circuit continuity and more particularly to devices for testing continuity in ring circuits used for electricity distribution in buildings.

Final distribution circuits for electricity within buildings in some countries may be implemented using ring circuits. FIG. 1 shows a ring circuit 100 which comprises a multi-core cable, or multiple single core cables, from a consumer unit (or breaker panel) having an overcurrent protection device 130 for the ring circuit 100 to a plurality of accessories 102-124, such as electrical outlet sockets, the multi-core cable returning to the overcurrent protection device 130 and forming a ring connecting each of the accessories 102-124 and the overcurrent protection device 130. The multi-core cable typically comprises a Live, Neutral and Earth connection, also called Hot, Neutral and Ground in some countries. Countries in which such ring circuits can be found include the United Kingdom, Republic of Ireland, United Arab Emirates, Singapore and Indonesia.

Ring circuits 100 are used in order to save cost by reducing the amount of conductor, typically copper, used in the electrical installation and also to reduce the number of overcurrent protective devices 130 that are required. The amount of conductor is reduced because, although there is a need for the conductor to return to the consumer unit, each accessories 102-124 has two paths for the current to the appliance to flow. If the load of the accessories 102-124 is evenly distributed around the ring circuit, the current in each conductor is half of the total load current, allowing the use of cable with half the current-carrying capacity of the overcurrent protection device 130. In practice, the load does not always split between the conductors evenly, so thicker cable is used, typically rated at perhaps two thirds of the current-carrying capacity of the overcurrent protection device 130. The overcurrent protection device 130 may be rated at, for example 32A, whilst the cable may be rated at, for example, 21 A. Typically, the maximum load for each of the accessories is 13 A.

The number of overcurrent protective devices 130 protecting individual circuits may also be reduced because a single ring circuit 100 may supply a larger area than a single radial circuit where the cable starts at the consumer unit and ends at the accessory furthest from the consumer unit. Additionally, the flexibility of provision of power for multiple small consumers of power is improved because larger areas and more appliances can be served by a single ring circuit 100. The use of a ring circuit 100 can also help to reduce the voltage drop at appliances because of the additional path for current to flow.

Although ring circuits 100 are typically used for circuits for the connection of accessories 102-124 such as power sockets, they can also be used for external lighting which may cover an extremely large area including walkways and landscaped areas. The use of a ring circuit 100 in these applications may assist in reducing the voltage drop to required levels at a lower cost. Ring circuits 100 may also be useful for lighting in industrial buildings, warehouses, supermarkets and retail park outlets for the same reason.

FIG. 2 shows a problem which may occur with a ring circuit 200. If either the live or neutral cable is discontinuous at any one point 202, all of the accessories 102-124 will still function, but what was a complete ring circuit 200 is now two separate radial circuits connected to the same overcurrent protective device 130. The first radial circuit supplies most of the accessories 102-122 and the second radial circuit supplies only a single accessory 124. If the discontinuity is at the center of the ring circuit 200 and the load is distributed evenly around the ring circuit 200 there is unlikely to be a problem. However, if the discontinuity 202 is towards one end of the ring circuit 200, one cable will be taking the majority of the load current and risks being overloaded. Since the conductor in the cable is typically only rated at two thirds of the rating of the overcurrent protective device 130, there is a danger of cable overheating and even a fire occurring before the overcurrent protective device 130 cuts off the circuit. Even if the cable does not overheat, operating the cable above its rated current may result in reduced cable life. On a radial circuit such a problem would be apparent to users since outlets downstream of the discontinuity would not function.

Continuity of the ring circuit 100 may be determined by disconnecting the ring circuit from the consumer unit and measuring the resistance between each end of each of the wires in the circuit. If the ring circuit 100 is continuous, this will be a low value. If the ring circuit 100 is not continuous, this will be a high value. Another way of determining continuity of the ring circuit 100 is to remove each of the accessories 102-124 and check that the two portions of the ring circuit 100 are connected. Either of these tests carries the risk that the act of replacing the wires in the consumer unit after measuring the resistance or replacing the accessory 102-124 may itself result in a connection being broken.

SUMMARY

Provided herein, in one or more aspects, is an apparatus for testing continuity of a ring circuit of an electricity distribution system, the ring circuit including at least a first conductor connecting, in a ring configuration, a source of electricity to a plurality of accessories. The apparatus includes, for instance: a switch arranged to cause a break in the ring circuit at a location in the ring circuit, the break resulting in a first end and a second end of the ring circuit at the location; a detector for measuring the relative voltage between the first end and the second end of the ring circuit; and an indicator which indicates, responsive to the detector detecting a relative voltage between the first end and the second end of the ring circuit, that there is a lack of continuity in the ring circuit.

In another aspect, provided herein is an apparatus for testing continuity of a ring circuit of an electricity distribution system, the ring circuit including at least a first conductor connecting, in a ring configuration, a source of electricity to a plurality of accessories. The apparatus includes, for instance: a switch arranged to cause a break in the ring circuit at a location in the ring circuit, the break resulting in a first end and a second end of the ring circuit at the location; a detector for measuring the relative voltage between the first end and the second end of the ring circuit; and a signal generator which signals, responsive to the detector detecting a relative voltage between the first end and the second end of the ring circuit, that there is a lack of continuity in the ring circuit.

In a further aspect, provided herein is a method of testing continuity of a ring circuit of an electricity distribution system, the ring circuit having at least a first conductor connecting, in a ring configuration, a source of electricity to a plurality of accessories. The method includes: providing a switch to cause a break in the ring circuit at a location in the ring circuit, the break resulting in a first end and a second end of the ring circuit at the location; providing a detector for measuring the relative voltage between the first end and the second end of the ring circuit; and providing an indicator, responsive to the detector detecting a relative voltage between the first end and the second end of the ring circuit, the indicator indicating that there is a lack of continuity in the ring circuit.

BRIEF DESCRIPTION OF THE DRAWINGS

Embodiments of the present invention are described below, by way of example only, with reference to the accompanying drawings, in which.

DETAILED DESCRIPTION

Figure 1:
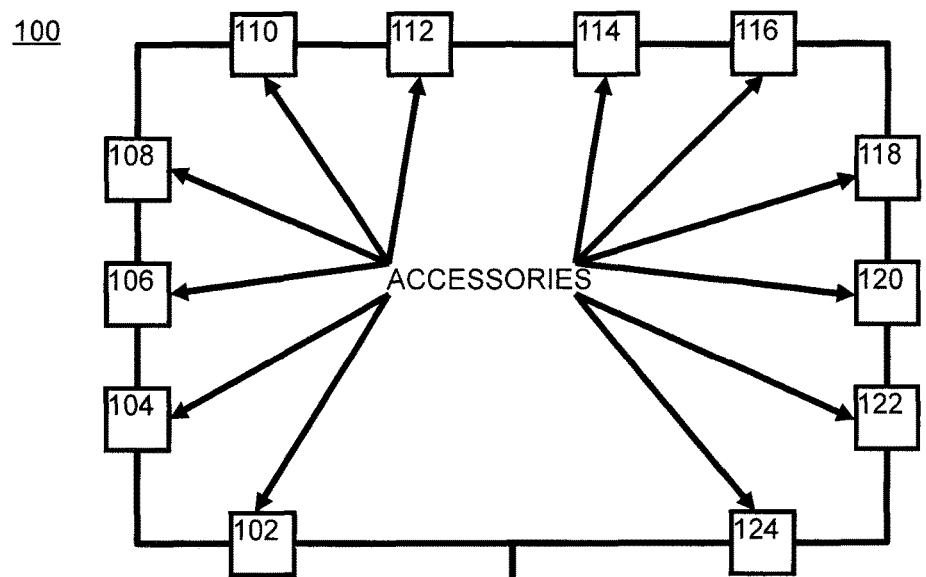
FIG. 1 shows a prior art ring circuit in which one or more aspects of the present invention may be implemented.
Figure 2:
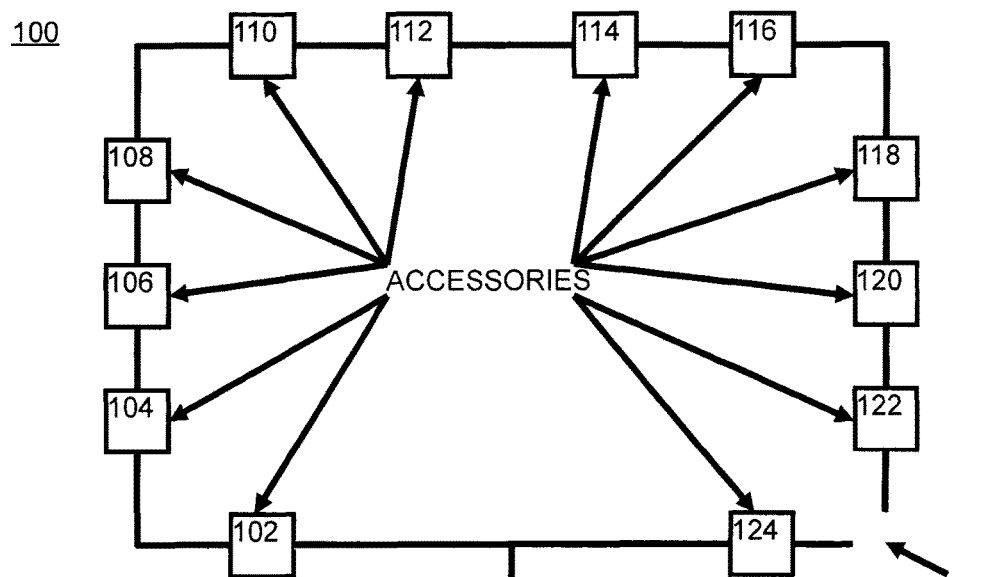
FIG. 2 shows the ring circuit of FIG. 1 in which there is a break in one of the conductors.
Figure 3:
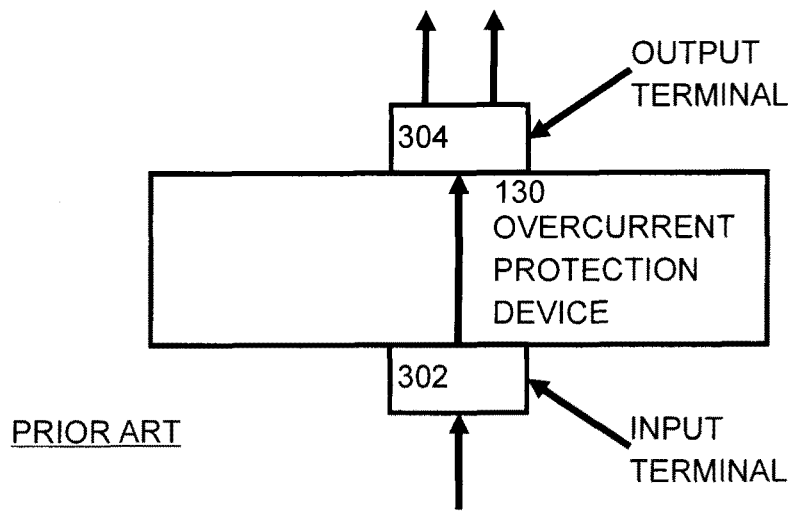
FIG. 3 shows one embodiment of the overcurrent protection device of FIG. 1.

FIG. 3 shows a prior art overcurrent protective device 130 such as might be used in the ring circuits of FIG. 1 and FIG. 2. Overcurrent protection device 130 receives an input voltage through input terminal 302 and provides an output voltage to each of the two connections of the ring circuit 100 through a single output terminal 304. Conventional overcurrent protection device 130 may comprise a bimetal strip in which the load current warms the bimetal strip which bends to trip the operating contacts. Conventional overcurrent protection device 130 may comprise a coil carrying the load current which attracts an iron part to trip the operating contacts. Conventional overcurrent protection device 130 may incorporate either or both of these principles or any other principle which achieves the overcurrent protection. Overcurrent protection device 130 is typically a single pole device protecting the live (or hot) circuit only.

Figure 4:
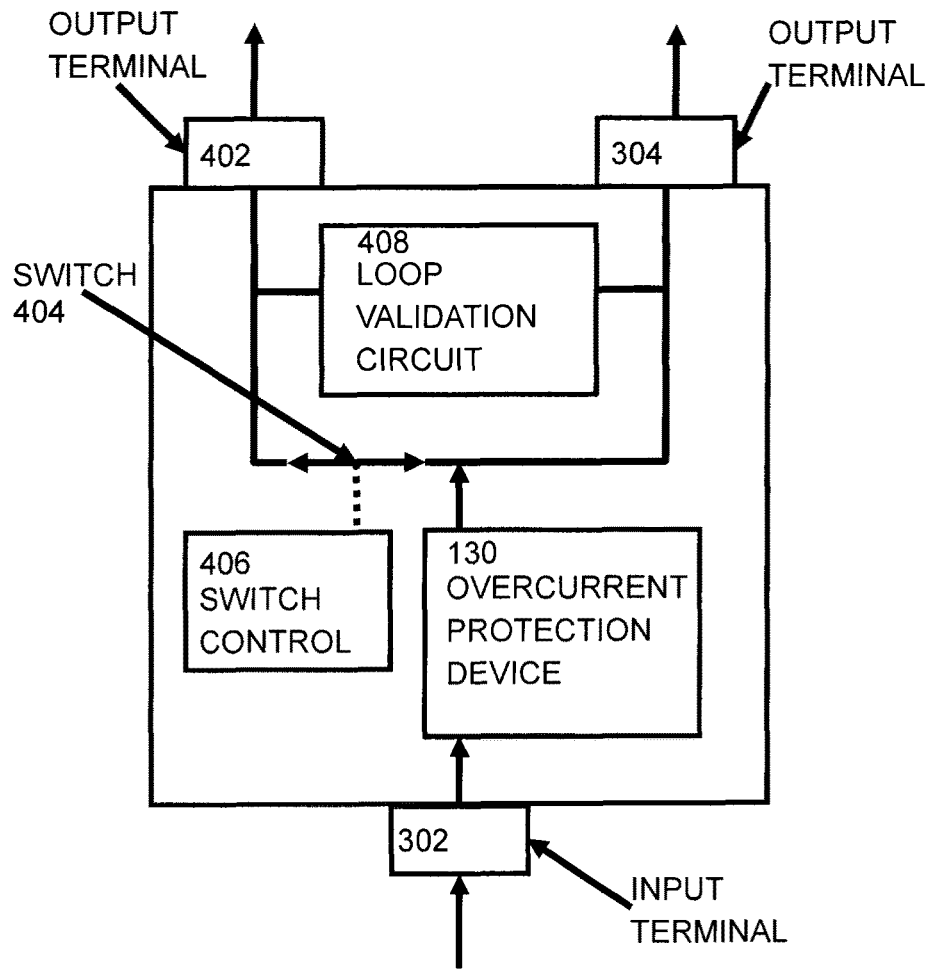
FIG. 4 shows an overcurrent protection device according to one or more aspects of the present invention, shown in a normal operating mode.

FIG. 4 shows one embodiment of an overcurrent protective device according to one or more aspects of the present invention, shown in a normal operating mode. Overcurrent protection device 130 receives an input voltage through input terminal 302 and provides an output voltage separately to each of the two connections of the ring circuit 100 through two separate output terminals 304, 402. In normal operation, switch 404 is closed and this allows the input voltage present on input terminal 302 to appear on the two separate output terminals 304, 402 in the same manner as the device of FIG. 3. Output terminal 304 is directly connected to overcurrent protection device 130. Output terminal 402 is connected to overcurrent protection device 130 through switch 404. Switch 404 is controlled by switch control 406 which ensures that switch 404 is closed in normal operation. Loop validation circuit 408 has separate connections to each of output terminals 304, 402 and operates to monitor the voltage on each of the output terminals 304, 402 and to instruct the overcurrent protection device 130 to indicate an overcurrent and/or to disconnect the input terminal 302 from the output terminals 304, 402 if it detects a difference in voltage between each of the output terminals 304, 402. In normal operation with switch 404 closed, there should be no voltage difference between the two monitoring inputs of loop validation circuit 408. Because of voltage drops around the ring circuit due to current being supplied to consumers of electricity connected to accessories in the ring circuit, there may be differing voltage drops between the input terminal and each of the output terminals. Such voltage drop is small, such as a few volts, when compared to the voltage difference being monitored. The voltage difference between output terminal 304 and output terminal 402 may be measured in a balanced manner, that is, by measuring the voltage of each of the output terminal 304 and output terminal 402 compared to a common reference.

Figure 5:
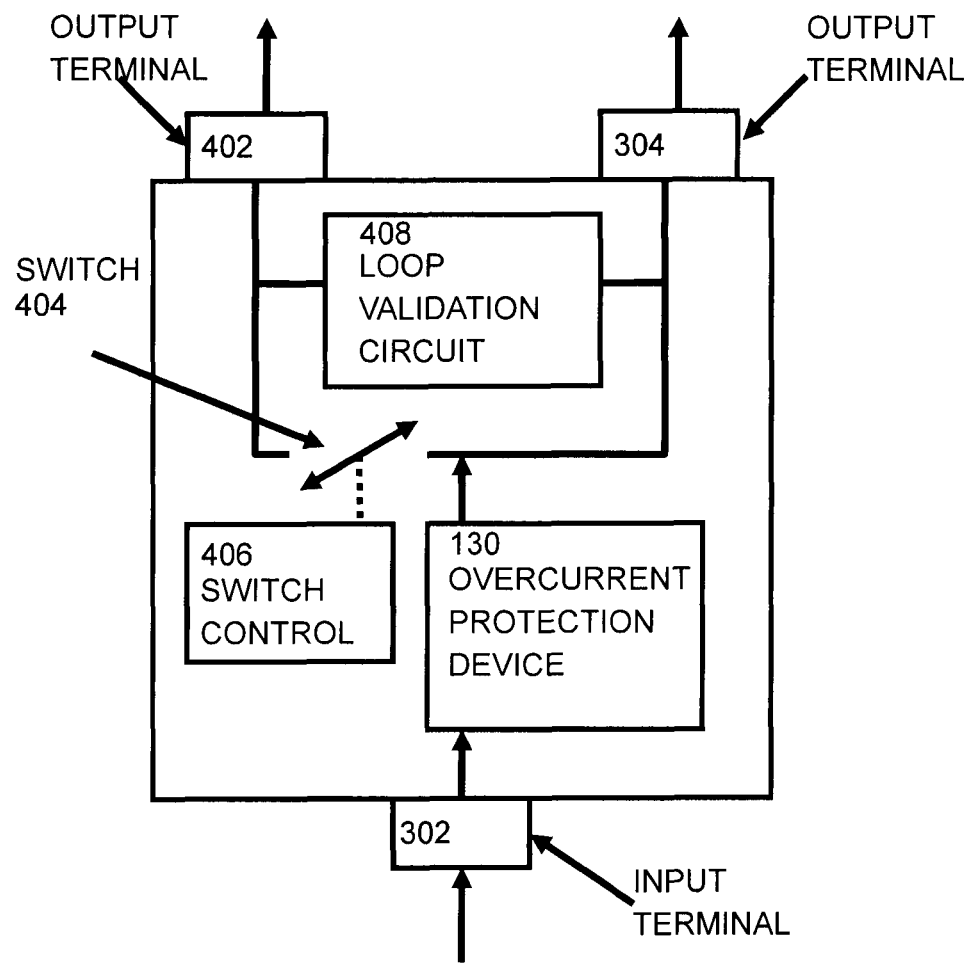
FIG. 5 shows the overcurrent protective device of FIG. 4 in a test mode.

FIG. 5 shows the overcurrent protective device of FIG. 4 in a test mode. In a test mode, switch control 406 is instructed to open switch 404. This allows the input voltage on input terminal 302 to be directly connected through to output terminal 304 only and not to output terminal 402. If the ring circuit 100 is continuous then the ring circuit 100 itself will make a connection between output terminal 304 and output terminal 402 thus resulting in the input voltage appearing on output terminal 402. Loop validation circuit 408 monitors the voltage on each of the output terminals 304, 402 and if the voltages are equal, loop validation circuit 402 does not instruct the overcurrent protection device to indicate a fault and/or to disconnect the input terminal 302 from the output terminals 304, 402. If the ring circuit 100 is not continuous then the ring circuit 100 will not make a connection between output terminal 304 and output terminal 402, thus resulting in the input voltage not appearing on output terminal 402. Loop validation circuit 408 monitors the voltage on each of the output terminals 304, 402, and if the voltages are unequal, loop validation circuit 402 instructs the overcurrent protection device to indicate a fault and/or to disconnect the input terminal 302 from the output terminals 304, 402.

The operation of the overcurrent protection function of the embodiment of FIG. 4 may be the same as that of the prior art overcurrent protection device of FIG. 3, with the exception that it needs to be capable of being tripped by loop validation circuit 408 when required to do so.

In the test mode, switch control 406 should allow switch 404 to remain open only for a short period of time in order to prevent overheating of the ring circuit 100 cable connected to output terminal 304 as this cable is now carrying all of the load current being drawn from the ring circuit 100 rather than the load current being shared between the cables connected to the two output terminals 304, 402. The short period of time may be determined as that period of time during which no significant overheating of the cable will occur.

In one embodiment, loop validation circuit 408 utilizes an integrated circuit chip or other solid state electronics to monitor the voltage present on each of the output terminals 304, 402 whilst switch 404 is opened in test mode.

Figure 6:
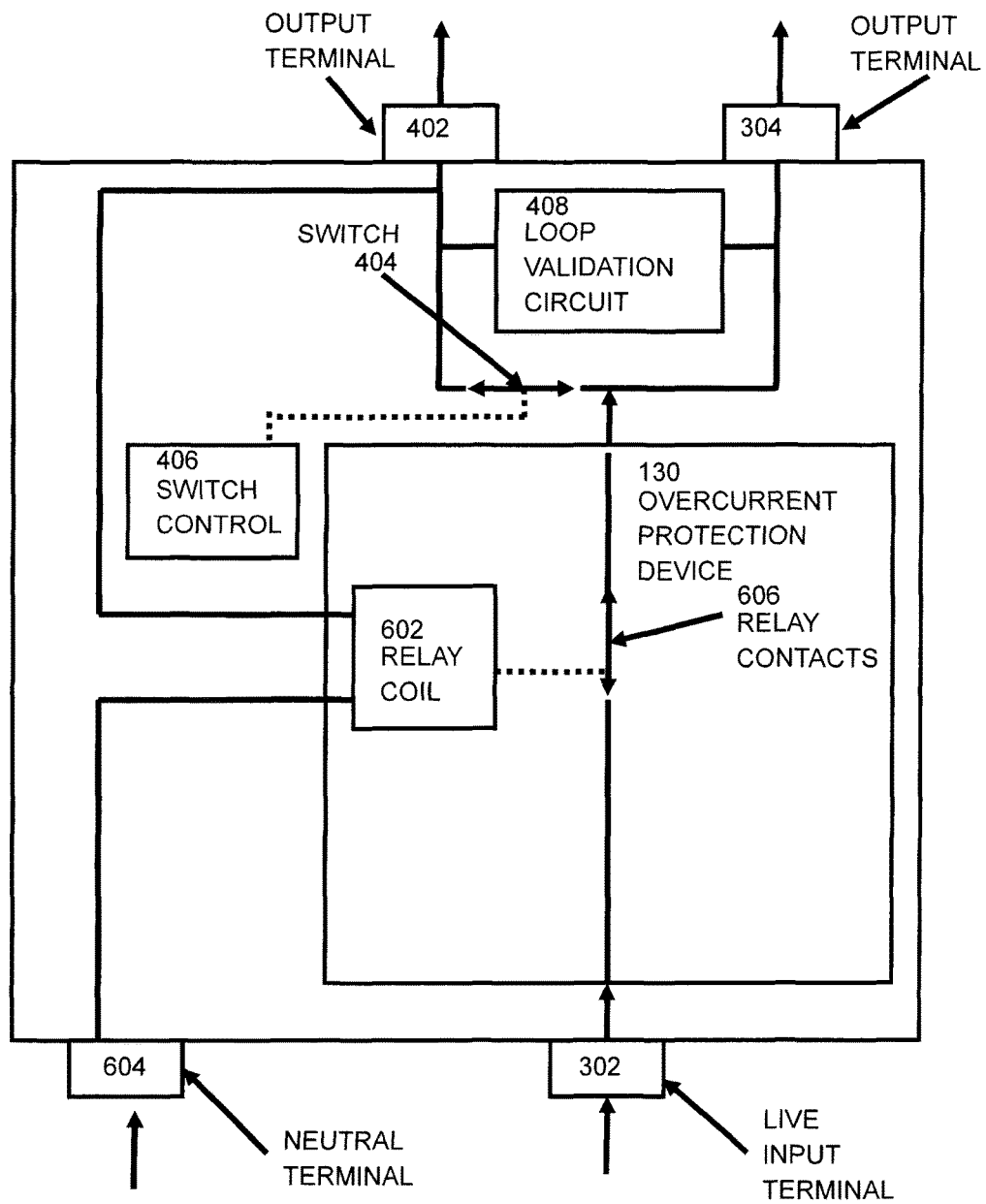
FIG. 6 shows an embodiment of the overcurrent protection device of FIGS. 4 and 5 in more detail.

In another embodiment, shown in FIG. 6, a single pole, single throw (SPST) relay may be used. Live input terminal 302, output terminal 304, output terminal 402, switch 404, switch control 406 and loop validation circuit 408 correspond with the same-numbered items in FIG. 4. Overcurrent protection device 130 comprises a coil based trip, which latches when off. A physical reset is required to latch the relay contacts 606 closed after a trip has occurred. Current from the live input terminal 302 to output terminal 404 and switch 404 passes through relay contacts 606 when the relay contacts 606 are closed. Relay contacts 606 are held closed by relay coil 602. Relay coil is connected between output terminal 402 and a neutral terminal 604 associated with live output terminal 402.

This arrangement of connections for the relay means that when switch 404 is opened by switch control 406, then if the ring circuit 100 is continuous without any breaks, the voltage at output terminal 304 is connected through the ring circuit to output terminal 402, which is itself connected to one terminal of the relay coil 602. If the ring circuit 100 is not continuous, that is there is a break in the ring circuit 100, then the voltage at output terminal 304 is not connected through the ring circuit to output terminal 402. Relay coil 602 thus has no voltage applied across it and so relay contacts 606 open and the power is removed from the ring circuit 100.

In one or more embodiments, the relay contacts 606 may be double pole contacts, and disconnect the neutral connection to the ring circuit 100 as well as the live connection.

Figure 7:
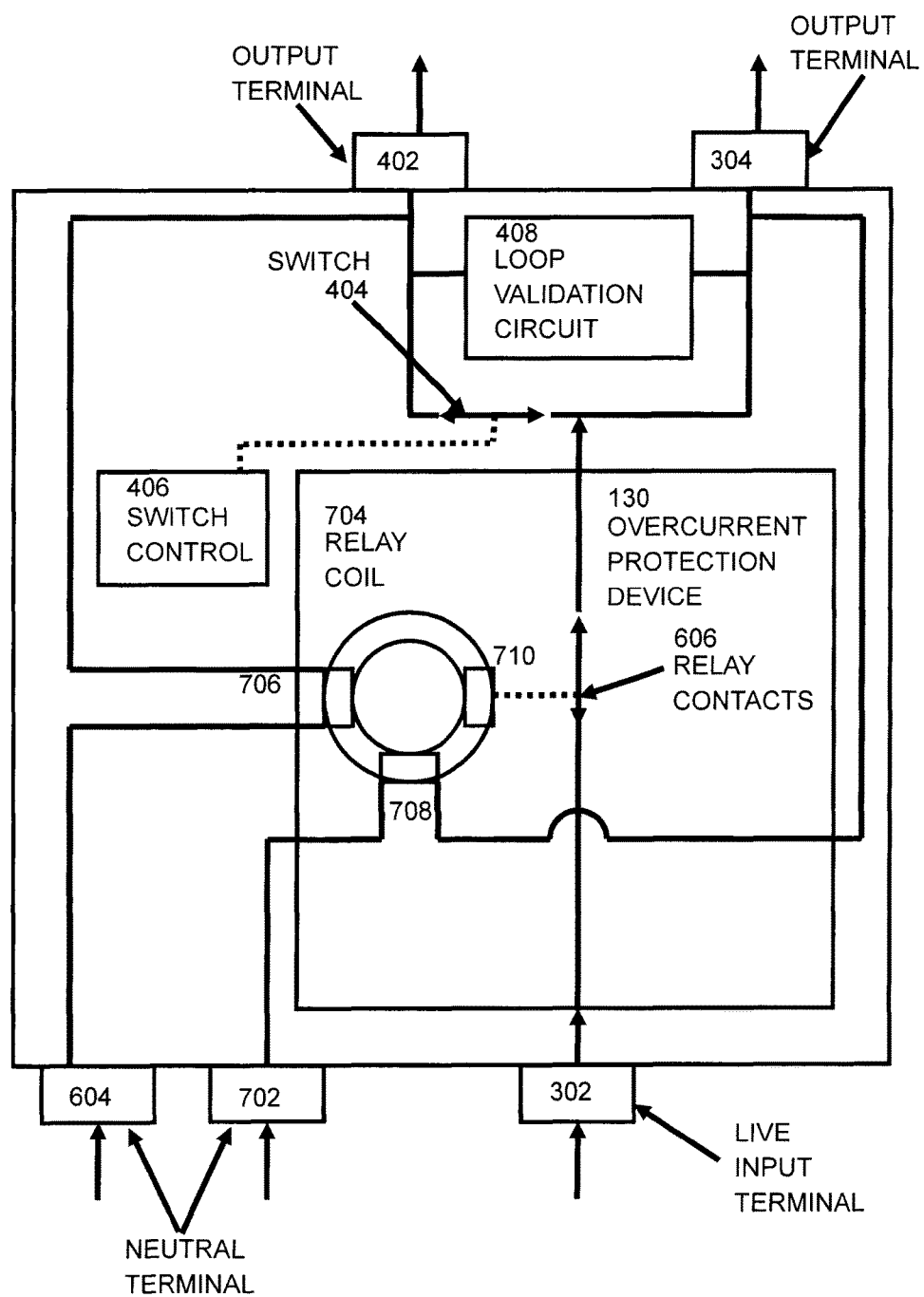
FIG. 7 shows another embodiment of the overcurrent protection device of FIGS. 4 and 5 in more detail.

The embodiments described above may activate in the event of a power outage. One embodiment that solves this problem is shown in FIG. 7. Relay coil 606 of FIG. 6 is replaced by relay coil 704. Relay coil 704 comprises two sense coils 706, 708 and a detector coil 710. Sense coils 706, 708 and detector coil 710 are arranged such that when the currents through sense coil 706 and 708 are balanced, then no current flows in detector coil 710 and relay contacts 606 remain closed. When current flows through only one of the sense coils 706, 708, such as sense coil 706 in FIG. 7, then current also flows in detector coil 710 and the relay contacts are opened. In the event of a power outage and subsequent return of power, the currents through sense coil 706 and 708 remain balanced and the trip does not need to be reset. When the switch 404 opens so as to test the ring circuit 100 continuity, then if the ring circuit 100 is continuous, current continues to flow through coil 706 via the ring circuit 100, and the currents in the sense coils 706, 708 remain balanced, with no current flow in detector coil 710 and the trip remains closed. If the ring circuit 100 is not continuous, then no current flows through coil 706 via the ring circuit 100, the currents in the sense coils 706, 708 are not balanced, current flows in detector coil 710 and the trip opens.

In one or more embodiments, a tell-tale, such as an indicator light or the mechanical position of an indicator may be used to indicate that there is a break in the ring circuit 100. In one embodiment, the switch control 406 may operate to test the ring circuit 100 at pre-determined intervals. In one embodiment, the switch control 406 may be operated by a button or a switch. Other embodiments may combine operation at pre-determined intervals together with operation by a button or switch.

In one embodiment, the overcurrent protective device 130 of FIGS. 4 and 5 may incorporate separate circuits for each of the live connections to the ring circuit 100 and the neutral connections to the ring circuit 100. Typically, such circuits are both operated whenever a fault is indicated on either of the circuits.

Although described herein with reference to a domestic electrical ring circuit 100 having a neutral, live and earth connection, other arrangements of ring circuit 100 may be implemented in accordance with the present invention. In one or more embodiments, the ring circuit 100 may comprise a single conductor with return current from the load returning through an electrode in the ground. An example of this may be an electric fence for retaining animals within an area which may have a ring circuit 100 which is energized at a voltage and in which the current path for any load current to flow is formed by the animal and a return path through the ground back to the electric fence apparatus. In this embodiment, there are no accessories as such, the accessories being the unfortunate animals (or humans) touching the fence and providing a conductive path to ground. A ring circuit 100 is typically used for the electric fence as the electric fence surrounds the area of land within which it is desired to enclose the animals. It is particularly desirable that any breaks in the ring circuit are detected quickly because any such breaks may leave a portion of the electric fence inoperative and thus allow animals to escape.

In another embodiment, the ring circuit 100 may comprise three conductors forming a three phase power supply. Accessories 102-124 may be appropriate sockets for the connection of a three phase supply or they may be sockets for a single phase supply with the connections to each accessory 102-124 being distributed between the three phases of the three phase supply. In a yet further embodiment, the ring circuit may be a ring main used in the distribution of electricity to substations and the accessories may be step-down transformers having their primary windings connected to the ring. Such an arrangement is typically used to allow any particular step-down transformer to be supplied via at least two different routes through the electricity network so as to improve resilience of the network in the event of bad weather or physical damage to the network. In this embodiment, it is likely that switch control 406 may already be present in the network as part of the normal operation of the network.

Figure 8:
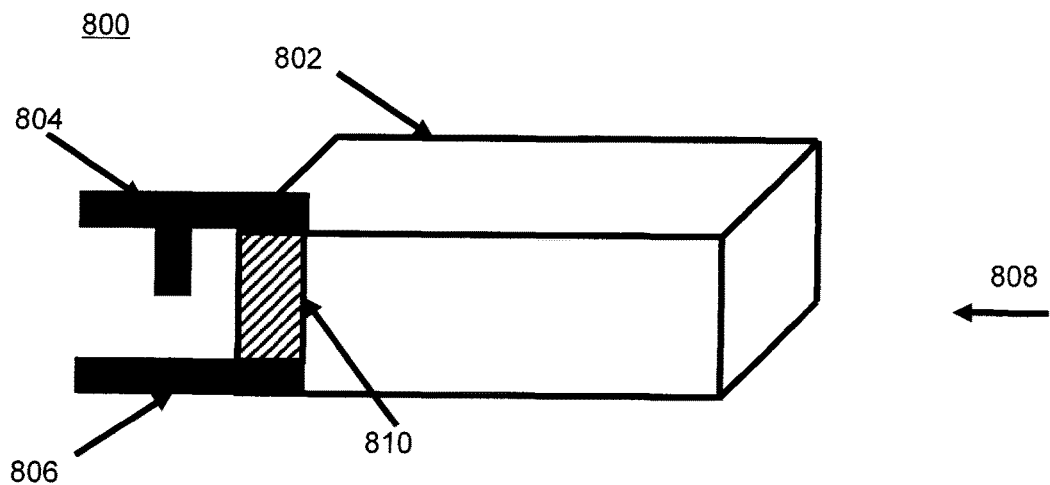
FIG. 8 shows a first portion of a test device according to another embodiment of the present invention, shown in a normal operating mode.

FIG. 8 shows a first portion 800 of a test device according to a third embodiment of the present invention in a normal operating mode. Hollow housing 802 forms part of one of the connections to the ring circuit 100 and allows the insertion of a prong to make connection with housing when the prong is inserted in the direction indicated by arrow 808. Housing 802 may be a conventional electrical connection formed by a socket within an accessory 102-124. The ring main 100 is connected to housing 802 through two connections 804, 806. Housing 802 is conductive over at least the hatched area indicated by arrow 810. The ring circuit 100 is completed through connection 804, conductive area 810 and connection 806. Connection 804 is maintained in contact with the conductive portion 810 of housing 8710. Such contact may be maintained by, for example, a spring. Housing 802 may be made entirely of conductive material, it may be conductive only in area 810 or any variation between these.

Figure 9:
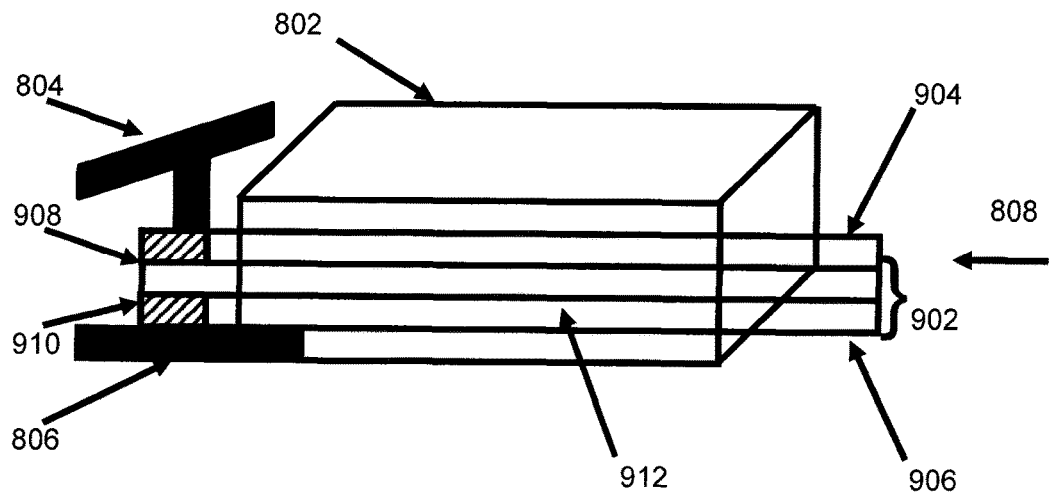
FIG. 9 shows the first portion of the test device of FIG. 8 with a second portion inserted so as to place the test device in a test mode, in accordance with one or more aspects of the present invention.

FIG. 9 shows the first portion 800 of the test device of FIG. 8 with a second portion 902 of the test device inserted in the direction shown by arrow 808 so as to place the test device in a test mode. Insertion of the second portion 902 of the test device into the housing 802 in the direction shown by the arrow 808 causes the second portion 902 to separate the two tightly coupled connections 804, 806. Second portion 902 comprises a first prong 904 electrically connected to the area 908 shown hatched in FIG. 9. In one embodiment, the entire first prong 904 may be conductive. In another embodiment, only area 908 may be conductive, with a conductor being located within the first prong 904 and extending along the length of first prong 904 to allow connection to be made at the end remote from area 908. First prong 904 makes electrical connection with connection 804, the connection 804 being one side of the ring circuit 100 and in normal operation being connected to connection 806 to form part of the ring circuit 100. Second portion 902 also comprises a second prong 906 electrically connected to the area 910 shown hatched in FIG. 9. In one embodiment, the entire second prong 906 may be conductive. In another embodiment, only area 910 may be conductive, with a conductor being located within the second prong 906 and extending along the length of second prong 906 to allow connection to be made at the end remote from area 910. Second prong 906 makes electrical connection with connection 806, the connection 806 being one side of the ring circuit 100 and in normal operation being connected to connection 804 to form part of the ring circuit 100. In one embodiment, first prong 904 and second prong 906 are separated by insulator 912. In another embodiment, insulator 912 separates only area 908 and area 910, with first 904 and second 906 prongs being insulated with a conductor located inside the insulating first prong 904 and second prong 906. First prong 904 and second prong 906 (or the conductors located therein) are connected to a loop validation circuit 408, which in normal operating mode reconnects connection 804 and connection 806 thus completing the ring circuit. In test mode, loop validation circuit 408 separates connection 804 and connection 806 performs the test for continuity of the ring circuit described above with reference to FIG. 5. Also, as described above, such separation of the connection 804 and connection 806 is typically for a short time only, to avoid overheating of the ring circuit 100 cables.

A ring circuit 100 may, as mentioned above, be formed of a number of separate connections, such as live, neutral and earth (or hot, neutral and ground) or be formed of three phase circuits. Any single one or any combination of these circuits may have individual second portions 902 which are inserted into the housing 802. The housing 802 may be an accessory 102-124 such as a conventional socket outlet. In an embodiment, the housing 802 forms part of the socket outlet. The socket outlet may have connection 804 and connection 806 located deeper into the socket outlet than a conventional prong associated with a normal plug for insertion in the socket outlet. Insertion of the conventional plug leaves connection 804 and connection 806 connected to each other and the integrity of the ring circuit 100 intact. Insertion of a plug according to an embodiment of the invention which has a longer second portion 902 than a conventional plug causes connection 804 and connection 806 to separate thus allowing testing of the continuity of the ring circuit.

Note that in one or more embodiments, an apparatus for testing continuity of a ring circuit of an electricity-driven system is provided. The ring circuit includes at least a first conductor connecting, in a ring configuration, a source of electricity to a plurality of accessories. The apparatus includes, for instance: a switch arranged to cause a break in the ring circuit at a location of the ring circuit, the break resulting in a first end and a second end of the ring circuit at the location; a detector for measuring the relative voltage between the first end and the second end of the ring circuit; and an indicator which indicates, responsive to the detector detecting a relative voltage between the first end and the second end of the ring circuit, that there is a lack of continuity in a ring circuit. The use of a switch arranged to cause a break in the detector to measure the relative voltage across the break advantageously removes the need for manual disconnection or inspection of connections in the ring circuit. Such manual disconnection or inspection carries the risk of disturbing the continuity of the ring circuit.

In a first embodiment, the switch causes the break in the ring circuit where the source of electricity is connected to the ring circuit and the apparatus further comprises means, responsive to the detector detecting a relative voltage between the first end and the second end of the ring circuit, for disconnecting the source of electricity from the ring circuit. This has the advantage that the ring circuit is made safe by disconnection of the source of electricity as soon as a fault is discovered.

In a second embodiment, the switch causes the break in the ring circuit where one of said plurality of accessories is connected to the ring circuit. This has the advantage that testing of the ring circuit for continuity may be completed at any location in the ring circuit where there is an accessory.

In a variation of the second embodiment, the switch is operated by insertion of a first type of contact into the one of said plurality of accessories, the switch not being operated by insertion of a second type of contact associated with consumers of electricity. This has the advantage of allowing normal operation of apparatus having the second type of contact connected to the ring circuit, but testing of the continuity of the ring circuit when apparatus having the first type of contact is connected to the ring circuit.

In one or more embodiments, the switch is operated for a short period of time; and the indicator, indicating that there is a discontinuity in the ring circuit, is a latching indicator thus maintaining the indication after the switch operation has completed. In an embodiment, the switch is operated at predetermined intervals. In another embodiment, the switch is operated by a manual control.

In an embodiment, the ring circuit has a first plurality of conductors and a respective switch and detector are provided for each of more than one of said first plurality of conductors.

In an embodiment, the accessories comprise socket outlets for connection of consumers of electricity to the source of electricity.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, column-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus for testing continuity of a ring circuit of an electricity distribution system, the ring circuit including at least a first conductor connecting, in a ring configuration, a source of electricity to a plurality of accessories, the apparatus comprising:
    a switch to cause a break in the ring circuit for a short period of time at a location in the ring circuit where the source of electricity provides an input voltage to the ring circuit, the break resulting in a first end and a second end of the ring circuit at the location, with one of the first end and the second end of the ring circuit continuing to receive the input voltage, and the break for the short period of time being sufficiently short to avoid overheating the ring circuit;
    a detector for measuring a relative voltage between the first end and the second end of the ring circuit; and
    an indicator which indicates, responsive to the detector detecting the relative voltage between the first end and the second end of the ring circuit, that there is a lack of continuity in the ring circuit.

2. The apparatus of claim 1, wherein the apparatus further comprises an overcurrent protection device controlled responsive to the detector detecting the relative voltage between the first end and the second end of the ring circuit to disconnect the source of electricity from the ring circuit.

3. The apparatus of claim 1, wherein:
    the indicator, indicating that there is a discontinuity in the ring circuit, is a latching indicator which maintains the indication after the switch operation has completed.

4. The apparatus of claim 3, wherein the switch is operated at predetermined intervals.

5. The apparatus of claim 3, wherein the switch is operated by a manual control.

6. The apparatus of claim 1, wherein the ring circuit comprises a plurality of conductors and the switch and the detector are a first switch and a first detector provided for one of the conductors of the plurality of conductors, and the apparatus further comprises a second switch and a second detector provided for another of the conductors of the plurality of conductors of the ring circuit.

7. The apparatus of claim 1, wherein the accessories comprise socket outlets for connection of consumers of electricity to the source of electricity.

8. An apparatus for testing continuity of a ring circuit of an electricity distribution system, the ring circuit including at least a first conductor connecting, in a ring configuration, a source of electricity to a plurality of accessories, the apparatus comprising:
- a switch to cause a break in the ring circuit for a short period of time at a location in the ring circuit where the source of electricity provides an input voltage to the ring circuit, the break resulting in a first end and a second end of the ring circuit at the location, with one of the first end and the second end of the ring circuit continuing to receive the input voltage, and the break for the short period of time being sufficiently short to avoid overheating the ring circuit;
- a detector for measuring a relative voltage between the first end and the second end of the ring circuit; and
- a signal generator which signals, responsive to the detector detecting the relative voltage between the first end and the second end of the ring circuit, that there is a lack of continuity in the ring circuit.

9. The apparatus of claim 8, wherein the apparatus further comprises an overcurrent protection device controlled responsive to the detector detecting the relative voltage between the first end and the second end of the ring circuit to disconnect the source of electricity from the ring circuit.

10. A method of testing continuity of a ring circuit of an electricity distribution system, the ring circuit including at least a first conductor connecting, in a ring configuration, a source of electricity to a plurality of accessories, the method comprising:

providing a switch to cause a break in the ring circuit for a short period of time at a location in the ring circuit where the source of electricity provides an input voltage to the ring circuit, the break resulting in a first end and a second end of the ring circuit at the location, with one of the first end and the second end of the ring circuit continuing to receive the input voltage, and the break for the short period of time being sufficiently short to avoid overheating the ring circuit;

providing a detector for measuring a relative voltage between the first end and the second end of the ring circuit; and providing an indicator, responsive to the detector detecting the relative voltage between the first end and the second end of the ring circuit, the indicator indicating that there is a lack of continuity in the ring circuit.

11. The method of claim 10, wherein the apparatus further comprises an overcurrent protection device controlled responsive to the detector detecting a relative voltage between the first end and the second end of the ring circuit, for disconnecting the source of electricity from the ring circuit.

12. The method of claim 10, wherein:
the indicator, indicating that there is a discontinuity in the ring circuit, is a latching indicator which maintains the indication after the switch operation has completed.

13. The method of claim 12, wherein the switch is operated at predetermined intervals.

14. The method of claim 12, wherein the switch is operated by a manual control.

15. The method of claim 10, wherein the ring circuit comprises a plurality of conductors and the switch and the detector are a first switch and a first detection provided for one of the conductors of the plurality of conductors, and the apparatus further comprises a second switch and a second detector provided for another of the conductors of the plurality of conductors of the ring circuit.

16. The method of claim 10, wherein the accessories comprise socket outlets for connection of consumers of electricity to the source of electricity.

* * * * *